United States Patent [19]

Pelella

[11] Patent Number: 5,366,908
[45] Date of Patent: Nov. 22, 1994

[54] PROCESS FOR FABRICATING A MOS DEVICE HAVING PROTECTION AGAINST ELECTROSTATIC DISCHARGE

[75] Inventor: Mario M. A. Pelella, Poughkeepsie, N.Y.

[73] Assignee: International Business Machines Corporation, Armonk, N.Y.

[21] Appl. No.: 152,640

[22] Filed: Nov. 16, 1993

Related U.S. Application Data

[62] Division of Ser. No. 930,872, Aug. 14, 1992.

[51] Int. Cl.$^5$ .................................... H01L 21/265
[52] U.S. Cl. ............................... 437/34; 437/59; 437/51; 437/904
[58] Field of Search .......... 437/59, 34, 44, 51, 437/55, 47, 904

[56] References Cited

U.S. PATENT DOCUMENTS

| | | | |
|---|---|---|---|
| 3,577,043 | 5/1971 | Cook | 317/235 R |
| 3,788,904 | 1/1974 | Haraszti | 437/59 |
| 4,139,935 | 2/1979 | Bertin et al. | 437/40 |
| 4,438,449 | 3/1984 | Usuda | 357/41 |
| 4,742,015 | 5/1988 | Ohagen | 437/59 |
| 4,786,956 | 11/1988 | Puar | 357/23.13 |
| 4,916,085 | 4/1990 | Frisina | 437/59 |
| 4,987,465 | 1/1991 | Longcor | 357/23.13 |
| 4,990,984 | 2/1991 | Misu | 357/23.13 |
| 4,994,874 | 2/1991 | Shimizu et al. | 357/23.13 |
| 5,182,220 | 1/1993 | Ker et al. | 437/34 |
| 5,246,872 | 9/1993 | Mortensen | 437/51 |
| 5,272,097 | 12/1993 | Shiota | 437/59 |

FOREIGN PATENT DOCUMENTS 63-124570  5/1988  Japan .................................. 257/356

OTHER PUBLICATIONS

"Gate Oxide Damage from Polysilicon Etching" by Calvin T. Gabriel, VLSI Technology, Inc., Technology Development Department, J. Vac. Sci. Technol. B9(2), Mar./Apr. 1991.

Primary Examiner—Tom Thomas
Assistant Examiner—Tuan Nguyen
Attorney, Agent, or Firm—Richard Lau

[57] ABSTRACT

A MOS device having protection against electrostatic discharge includes a protection diode formed below the MOS device so that excess charge buildup in the MOS device is conducted away from the MOS device by the protection diode.

23 Claims, 3 Drawing Sheets

PROCESS FOR FABRICATING A MOS DEVICE HAVING PROTECTION AGAINST ELECTROSTATIC DISCHARGE

RELATED U.S. APPLICATION DATA

This application is a divisional application of U.S. Ser. No. 07/930,872, filed Aug. 14, 1992, pending.

TECHNICAL FIELD

The present invention relates generally to MOS devices and, more particularly, to a MOS device having protection against electrostatic discharge and, even more particularly, to a MOS device having protection against electrostatic discharge during manufacturing.

BACKGROUND OF THE INVENTION

In recent years, electrostatic discharge (ESD) has become an increasingly critical factor in the yield and reliability of MOS-type integrated circuits. Specifically, ESD has been known to result in the destruction of MOS devices to the inputs and/or outputs of the completed integrated circuit of which the MOS device is a component. In reaction, numerous protection circuits have been developed by circuit designers to solve the problem of damage to MOS devices caused by ESD. Some of these protection circuits have been somewhat effective in protecting input and output MOS devices during an ESD transient. However, the problem of ESD has not yet been effectively addressed in regard to protecting MOS devices during early stages of manufacturing or processing of MOS-type integrated circuits, i.e., prior to completion of the MOS-type integrated circuit.

As a specific example, protection against ESD damage is particularly important for today's MOS transistors which utilize very thin gate oxides and shallow source/drain junctions. For instance, present day MOS transistor gate oxides can have a thickness of approximately 100 Angstroms or less, and source/drain junctions of 2000 Angstroms or less. Such very thin gate oxides and shallow source/drain junctions are highly vulnerable to being damaged by ESD. By way of example, some dry etching techniques implemented during manufacturing, such as reactive ion etching or plasma etching, can create electrostatic charge on a gate which exceeds the dielectric field strength of the gate oxide, thereby causing breakdown of the gate oxide and destruction of the MOS transistor. See, for example, "Dielectric Breakdown of Gate Insulator Due to Reactive Ion Etching", by T. Watanabe and Y. Yoshida, *Solid State Technology*, April, 1984, pp. 263-266. Generally, the dielectric field strength of a 100 Angstrom gate oxide is approximately 10 MV/cm, and electrostatic charge of 10 V would exceed this dielectric field strength so as to cause breakdown of the gate oxide.

Thus, there remains a need for protection against damage to MOS-type devices, such as, MOS transistors, caused by ESD. Such protection is more particularly required during the manufacturing of integrated circuits having MOS devices integrated therein.

SUMMARY OF THE INVENTION

Broadly speaking, the present invention relates to a MOS device having protection against electrostatic discharge, and a process for fabricating the same. The MOS device includes a semiconductor substrate, and an epitaxial layer grown on the semiconductor substrate. A tie-down region is formed in the epitaxial layer, and a protection diode is formed in the tie-down region. An insulating layer is grown on the epitaxial layer, and the insulating layer has a buried protection diode window formed therein at a location directly above the protection diode so as to expose the protection diode. A conductive layer is deposited on the insulating layer, such that the conductive layer fills the buried protection diode window and contacts the protection diode. Thus, excess charge buildup in the MOS device is conducted through the conductive layer and away from the MOS device by the protection diode.

In a particular example of the present invention, a MOS transistor has protection against electrostatic discharge by having a buried protection diode formed below the gate of the transistor.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENTS

Although the specific example given hereinafter is of a MOS transistor, it should be fully understood by those skilled in the art that the present invention has applicability and usefulness in any thin oxide MOS device which requires protection against ESD. By way of example, such devices may include on-chip capacitors, trench capacitors, polysilicon resistors, or the like.

Figure 1A:
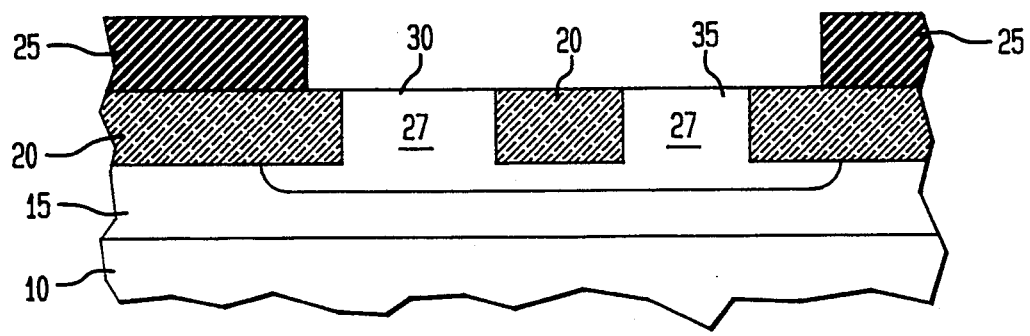
FIGS. 1A-1B, 2-5 show consecutive process steps in accordance with the present invention for fabricating a MOS transistor having a buried gate protection diode for protection against ESD during subsequent processing of the MOS transistor.

Referring initially to FIG. 1A, there is shown a semiconductor substrate 10 having an epitaxial layer 15 grown thereon by conventional methods. Depending upon whether an NMOS or PMOS transistor is being fabricated, the epitaxial layer 15 can either be N-type or P-type. Isolations 20 are formed in the epitaxial layer 15. In conjunction with the gate, the isolations 20 define the source and drain regions of the MOS transistor. The isolations 20 can be formed by conventional methods, such as by local oxidation of silicon (LOCOS), trench-/refill (CVD $SiO_2$), or the like.

A photoresist mask 25 is applied and an impurity having a conductivity opposite to the conductivity of the epitaxial layer 15 is implanted into the epitaxial layer 15 so as to form a well 27 having well regions 30,35. Those skilled in the art will understand that the advantages associated with having one integrated well 27 for each MOS transistor fabricated is related to layout density and conservation of real estate. As described hereinbelow, well region 30 will be used to form the source and drain regions of the MOS transistor, and drain regions of the MOS transistor, and well region 35 will be used to form a buried diode for protection of the MOS transistor. In this way, the buried diode is integrated as part of the MOS transistor structure.

As an example, if an NMOS transistor is being fabricated, then an P-type impurity, such as boron, can be implanted into the N-type epitaxial layer 15 so that the well regions 30,35 will be P-type regions; and if a PMOS transistor is being fabricated, then a N-type impurity, such as phosphorous, can be implanted into the P-type epitaxial layer 15 so that the well regions 30,35 will be N-type regions.

Figure 1B:
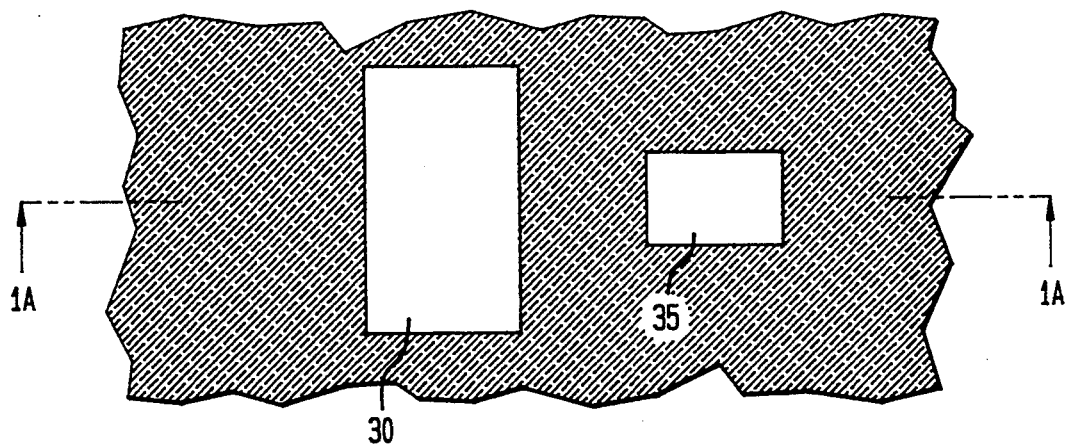

FIG. 1B shows a top view of the structure of FIG. 1A, but without the photoresist mask 25 applied thereto. As described hereinbelow, well region 30 is used to form the active source and drain regions of the MOS transistor, and well region 35 is used to form a tie-down region which will be included as part of the protection circuit in accordance with the present invention.

Figure 2:
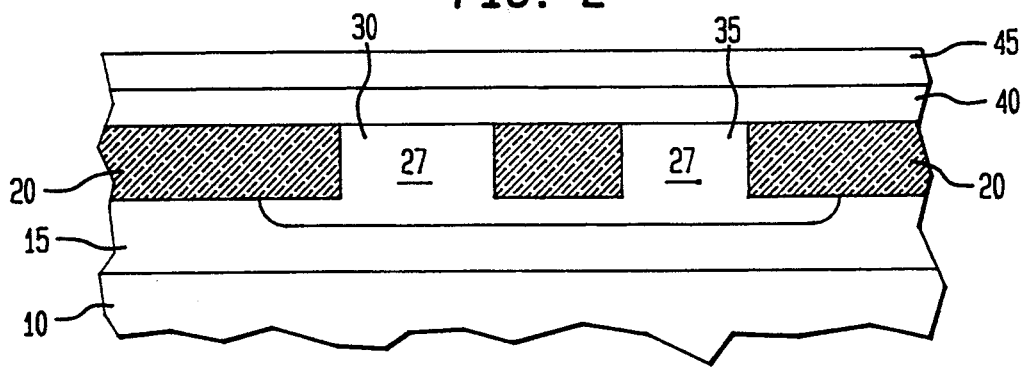

As shown in FIG. 2, after formation of the well regions 30,35, a layer of oxide 40 is grown on the epitaxial layer 15 using conventional methods. The layer of oxide 40 is used for formation of a gate, and those skilled in the art will appreciate that other insulating material can be used in lieu of oxide, such as nitride, a composite of oxide and nitride, or the like. As mentioned in the Background of the Invention, in today's technology this layer of gate oxide 40 can have a thickness of approximately 100 Angstroms or less.

Optionally, some processes may require there to be a layer of protective polysilicon 45 deposited on the layer of gate oxide 40. Generally, the protective polysilicon layer 45 has a thickness of approximately 600 Angstroms. The protective polysilicon layer 45 functions to protect the gate oxide 40 from contamination during further processing. However, it should be understood that the protective polysilicon layer 45 may not be required for fabrication of the MOS transistor, and is not essential to the practice of the present invention.

Figure 3:
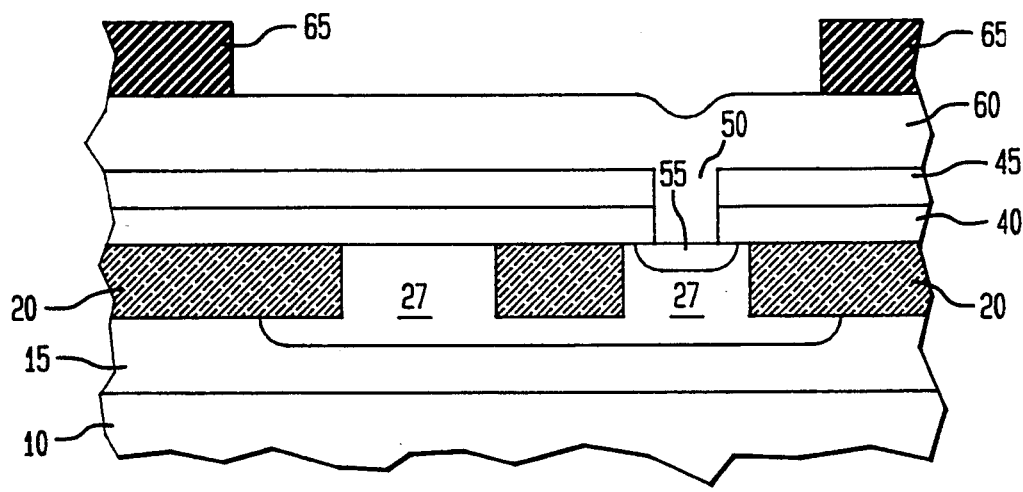

As shown in FIG. 3, the layer of gate oxide 40 and the protective polysilicon layer 45 (if included) are then etched so as to form a buried protection diode window 50. For reasons explained hereinbelow, it is important that the buried protection diode window 50 be located substantially directly above the well region 35 for forming the protection circuit. A layer of gate polysilicon 60 is then deposited over the protective polysilicon layer 45. It should be understood that another layer of conductive material, such as metal, single crystal Si, or the like can be substituted for the layer of gate polysilicon 60.

The gate polysilicon 60 must fill the buried protection diode window 50 so as to cover and contact the tie-down region 35. An impurity of a conductivity opposite the conductivity of the well 35 is then implanted into the well region 35 and gate polysilicon 60 so as to form the source/drain regions of the MOS transistor and gate polysilicon dopant. Preferably, subsequently, a buried diode region 55 is formed by the out-diffusion of dopant impurities from the gate polysilicon 60 utilizing conventional MOS annealing heat treatments. Alternatively, the buried diode region 55 can be formed by a separate step of ion implantation prior to deposition of the gate polysilicon 60. It should be important to understand that the buried diode region 55 can be contacted through the buried protection diode window 50.

The buried diode region 55 and the well region 35 form a buried diode. Illustratively, the gate polysilicon layer 60 can have a thickness over the gate oxide 40 and protective polysilicon 45 of approximately 0.1 micrometers. A photoresist mask 65 is then applied over the gate polysilicon 60 for formation of the gate.

Figure 4:
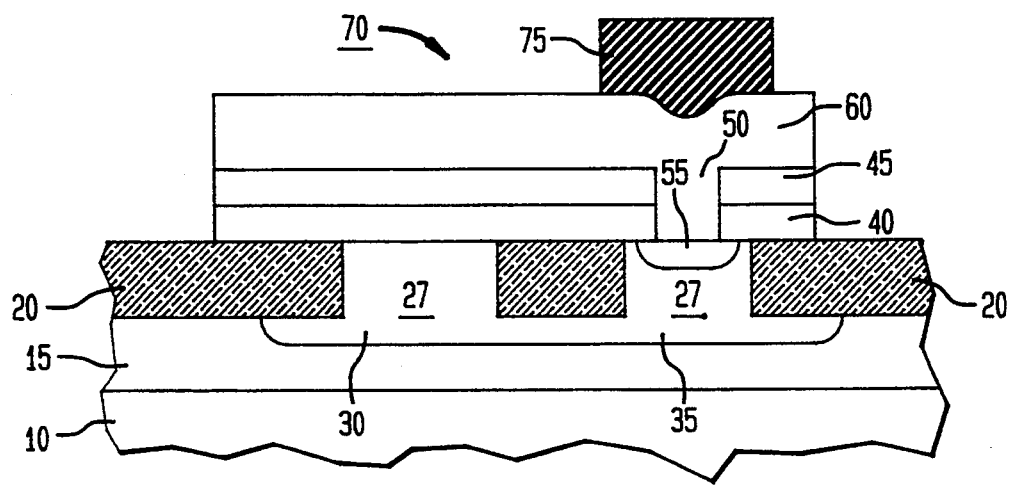

Referring now to FIG. 4, the gate polysilicon layer 60, protective polysilicon layer 45 and gate oxide layer 40 are then etched so as to form gate 70. Conventionally, metal is then deposited and etched to form a gate contact 75 so as to complete the MOS transistor. A layer of thin-film insulation (not shown), such as tetraethoxysilane (TEOS), CVD $SiO_2$, PSG, etc, can then be applied over the transistor for isolation of metallization levels.

Thus, the transistor or, more specifically, the gate polysilicon 60 is tied down so as to form a protection circuit. Advantageously, the protection circuit is formed at a very early stage of chip manufacture, and no metallization layers are utilized for such formation. The protection circuit protects the transistor during subsequent manufacturing steps. For example, if electrostatic charge on the gate 70 was to exceed the dielectric field strength of the gate oxide 40, the excess charge build-up would be conducted through the gate polysilicon 60 and away from the MOS transistor either by the forward operation or by the reverse saturation current of the diode formed by the buried diode region 55 and the well region 35. Accordingly, damage to the transistor is prevented.

Figure 5:
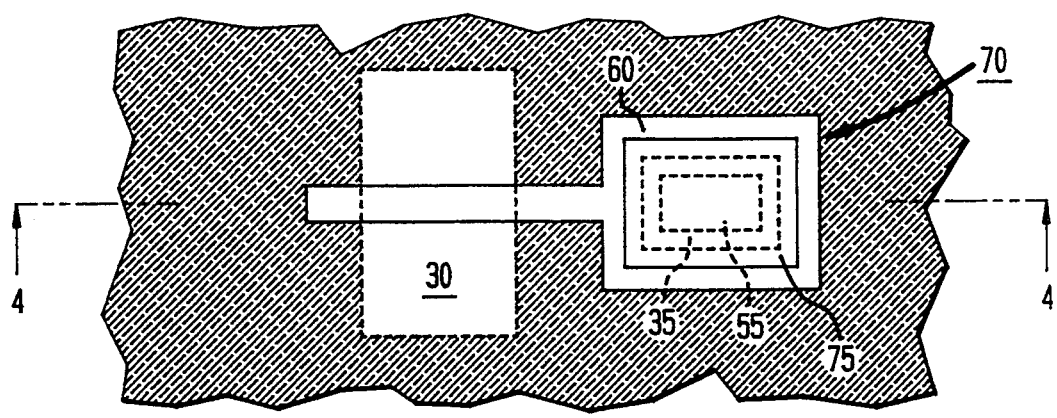

As can be seen in FIG. 5, the buried diode region 55 is located directly below the gate 70 of the transistor. Thus, advantageously, no additional real estate or silicon area on the surface of the wafer is required for addition of the protection circuit. In other words, the buried diode is situated within the same silicon area that the gate 70 of the MOS transistor occupies so that no additional real estate is required for the addition of the buried diode.

Furthermore, since no additional silicon area is required by the addition of the buried protection diode, no metallization wiring channels are blocked by the protection circuit. This holds true for either used or unused MOS transistors.

Additionally, it should be noted that this protection circuit is particularly desirable and easily implemented in most BiCMOS technologies since the photoresist mask for forming the buried protection diode window 50 is already available. For example, this would be the case if the gate conductive material of the MOS transistor is the same as the base conductive material of the bipolar transistor being utilized in the BiCMOS technology; or, alternatively, this would also be the case if the gate conductive material of the MOS transistor is the same as the emitter conductive material of the bipolar transistor being utilized in the BiCMOS technology. Formation of the buried protection diode window 50 would then be "free".

More specifically, the same photoresist mask used in the formation of either the opening for the base or emitter, whichever the case may be, of the bipolar device can be altered to include, an opening for the buried protection diode window 50, and these openings can then be formed in the same step. In this manner, no additional photoresist mask and/or process step is required to form the buried protection diode window 50, and its formation is thus considered to be "free". As such, no additional step is required to form the protection circuit of the present invention.

Figure 6:
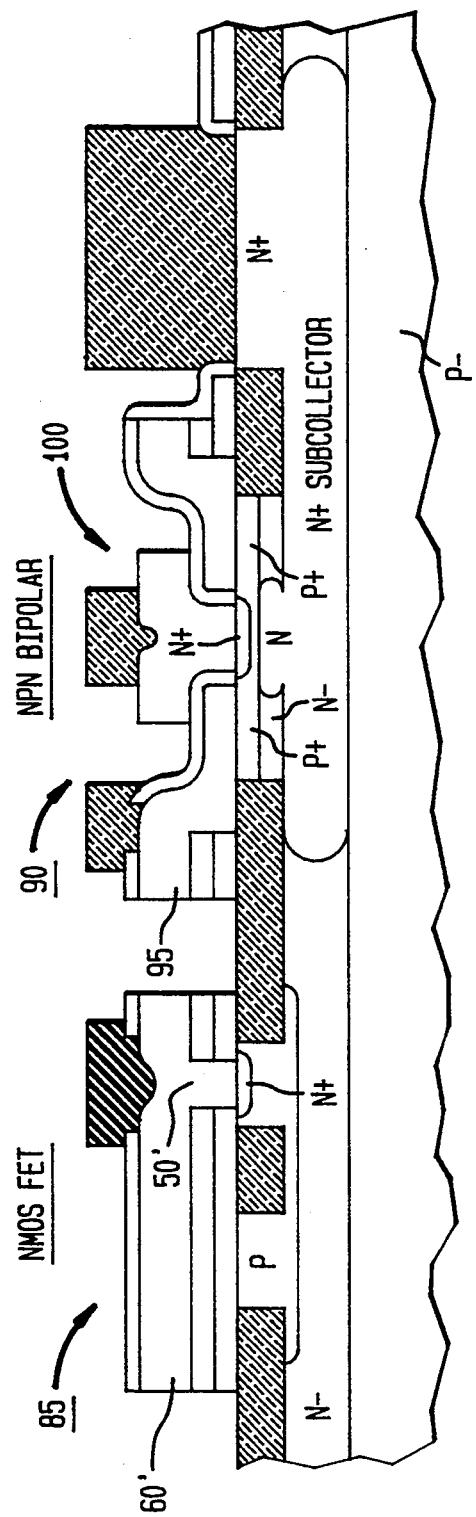
FIG. 6 illustrates a specific example of utilization of the present invention in a BiCMOS technology.

A specific example of a BiCMOS technology involving an NMOS transistor 85 and an NPN transistor 90 is shown in FIG. 6. In this example, the material of the gate polysilicon 60' of the NMOS transistor 85 is the same as the material of the base polysilicon 95 of the NPN transistor 90. The opening for the base of the NPN transistor 90 is referenced generally by the reference numeral 100. By altering the photoresist mask used to form the base opening of the NPN transistor 90, the buried protection diode window 50' can be formed in the same etch step required to form the base opening of the NPN transistor 90. The gate polysilicon 60' and the base polysilicon 95 can then also both be deposited in one process step. Thus, since the photoresist mask and etch step used for forming the buried protection diode window 50' are already required for forming the base opening of the NPN transistor 90, formation of the buried protection diode window 50' is considered to be "free".

Those skilled in the art will realize that this concept of forming the buried protection diode window for "free" can be extended to other technologies in which thin oxide devices are susceptible to ESD-like transients. For example, a protection diode window may also be formed for the devices mentioned hereinabove, specifically, such devices may include on-chip capacitors, trench capacitors, polysilicon resistors, or the like.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A process for fabricating a MOS device having protection against electrostatic discharge, comprising the steps of:

providing a semiconductor substrate;
   growing an epitaxial layer on said semiconductor substrate;
   forming a tie-down region in said epitaxial layer;
   growing a layer of insulating material on said epitaxial layer for forming an insulating layer of an electrode of a MOS device;
   forming a buried protection diode window through said electrode insulating layer at a location directly above said tie-down region so as to expose said tie-down region;
   depositing a layer of conductive material over said electrode insulating layer for forming a conductive layer of said electrode of the MOS device, said layer of conductive material filling said buried protection diode window and forming a protection diode in said tie-down region; and
   etching said layer of conductive material and said layer of insulating material so as to form said electrode of the MOS device, said protection diode being formed directly below said electrode insulating layer such that said protection diode is formed integrally as part of the MOS device;
   wherein excess charge buildup in the MOS device is conducted through said electrode conductive layer and away from the MOS device by said protection diode.

2. A process for fabricating a MOS device according to claim 1, wherein said layer of insulating material comprises oxide.

3. A process for fabricating a MOS device according to claim 1, wherein said layer of insulating material comprises nitride.

4. A process for fabricating a MOS device according to claim 1, wherein said layer of insulating material comprises oxide and nitride.

5. A process for fabricating a MOS device according to claim 1, wherein said layer of conductive material comprises polysilicon.

6. A process for fabricating a MOS device according to claim 1, wherein said layer of conductive material comprises metal.

7. A process for fabricating a MOS device according to claim 1, wherein said layer of conductive material comprises single crystal silicon.

8. A process for fabricating a MOS transistor having protection against electrostatic discharge, comprising the steps of:

providing a semiconductor substrate;
   growing an epitaxial layer on said semiconductor substrate;
   forming isolations in said epitaxial layer;
   forming a source region of a MOS transistor, a drain region of the MOS transistor and a tie-down region in said epitaxial layer between said isolations, said regions being defined by said isolations;
   growing a layer of insulating material on said epitaxial layer for forming a gate insulating layer of the MOS transistor;
   forming a buried protection diode window through said gate insulating layer at a location directly above said tie-down region so as to expose said tie-down region;
   depositing a layer of conductive material over said gate insulating layer for forming a gate conductive layer of the MOS transistor, said layer of conductive material filling said buried protection diode window and forming a protection diode in said tie-down region; and
   etching said layer of conductive material and said layer of insulating material so as to form a gate of the MOS transistor, said protection diode being formed directly below said gate insulating layer such that said protection diode is formed integrally as part of the MOS transistor;
   wherein excess charge buildup in the MOS transistor is conducted through said gate conductive layer and away from the MOS transistor by said protection diode.

9. A process for fabricating a MOS transistor according to claim 8, wherein said layer of insulating material comprises oxide.

10. A process for fabricating a MOS transistor according to claim 8, wherein said layer of insulating material comprises nitride.

11. A process for fabricating a MOS transistor according to claim 8, wherein said layer of insulating material comprises oxide and nitride.

12. A process for fabricating a MOS transistor according to claim 8, wherein said layer of conductive material comprises polysilicon.

13. A process for fabricating a MOS transistor according to claim 8, wherein said layer of conductive material comprises metal.

14. A process for fabricating a MOS transistor according to claim 8, wherein said layer of conductive material comprises single crystal silicon.

15. A process for fabricating a MOS transistor according to claim 8, wherein said protection diode is formed in said tie-down region by out-diffusion.

16. A process for fabricating a MOS transistor according to claim 8, wherein said protection diode is formed in said tie-down region by ion implantation.

17. A process for fabricating a MOS transistor according to claim 8, wherein the MOS transistor is a NMOS transistor.

18. A process for fabricating a MOS transistor according to claim 8, wherein the MOS transistor is a PMOS transistor.

19. A process for fabricating a MOS transistor according to claim 8, further comprising the step of depositing a protective layer on said layer of insulating material prior to said step of forming a buried protection diode window, said protective layer protecting said layer of insulating material from contamination during processing.

20. A process for fabricating a MOS transistor according to claim 19, wherein said protective layer comprises polysilicon.

21. A process for fabricating a MOS transistor according to claim 8, wherein said layer of insulating material has a thickness of less than 100 Angstroms.

22. A process for fabricating a MOS transistor according to claim 8, wherein the process is implemented in a BiCMOS technology, wherein said layer of conductive material of the MOS transistor comprises the same material used to form a base of a bipolar transistor, and wherein said buried protection diode window and an opening for the base of the bipolar transistor are formed in one process step.

23. A process for fabricating a MOS transistor according to claim 8, wherein the process is implemented in a BiCMOS technology, wherein said layer of conductive material of the MOS transistor comprises the same material used to form an emitter of a bipolar transistor, and wherein said buried protection diode window and an opening for the emitter of the bipolar transistor are formed in one process step.

* * * * *